(12) United States Patent
Nakamura (10) Patent No.: US 7,454,820 B2
(45) Date of Patent: Nov. 25, 2008

(54) METHOD OF MANUFACTURING A PLURALITY OF LAMINATED STRUCTURES

(75) Inventor: Takashi Nakamura, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 231 days.

(21) Appl. No.: 11/407,282

(22) Filed: Apr. 20, 2006

(65) Prior Publication Data

US 2006/0186493 A1    Aug. 24, 2006

Related U.S. Application Data

(62) Division of application No. 10/927,114, filed on Aug. 27, 2004, now Pat. No. 7,087,970.

(30) Foreign Application Priority Data

Aug. 29, 2003   (JP)   ............................. 2003-307663

(51) Int. Cl.
  *H01L 41/42*   (2006.01)
  *H04R 17/00*   (2006.01)
(52) U.S. Cl. ...................... 29/25.35; 29/412; 29/592.1; 257/415; 310/366
(58) Field of Classification Search ................ 29/25.35, 29/412, 415, 594, 828, 830, 842, 843, 846, 29/592.1, 825; 257/415, 758; 310/328, 334, 310/363, 366; 367/140
  See application file for complete search history.

(56) References Cited

U.S. PATENT DOCUMENTS

| | | | | |
|---|---|---|---|---|
| 5,173,162 A |   | 12/1992 | Ikuo et al. | |
| 5,438,232 A | * | 8/1995 | Inoue et al. | 310/328 |
| 5,548,554 A |   | 8/1996 | Smith | |
| 6,172,591 B1 | * | 1/2001 | Barrett | 338/22 R |
| 6,661,158 B2 | * | 12/2003 | Kawazoe | 310/328 |
| 2002/0084872 A1 |   | 7/2002 | Kawazoe | |

FOREIGN PATENT DOCUMENTS

| | | |
|---|---|---|
| JP | 5-343440 | 12/1993 |
| JP | 2000-087212 | 3/2000 |
| JP | 2001-102650 | 4/2001 |
| JP | 2002-118305 A | 4/2002 |
| JP | 2003-037308 A | 2/2003 |

* cited by examiner

*Primary Examiner*—Donghai D. Nguyen
(74) *Attorney, Agent, or Firm*—Sughrue Mion, PLLC (57) ABSTRACT

A laminated structure with less breakage of an insulative layer due to stress and easy interconnection. The laminated structure includes at least a first electrode layer, a dielectric layer and a second electrode layer stacked in this order. The first electrode layer includes a first electrode material disposed such that an end surface thereof is exposed in a first side region of the laminated structure and a second electrode material having an insulating film formed on an end surface in a second side region of the laminated structure. The second electrode layer includes the first electrode material disposed such that an end surface is exposed in the second side region of the laminated structure and the second electrode material having an insulating film formed on an end surface in the first side region of the laminated structure.

4 Claims, 9 Drawing Sheets

METHOD OF MANUFACTURING A PLURALITY OF LAMINATED STRUCTURES

This is a divisional of application Ser. No. 10/927,114 filed Aug. 27, 2004, issued as U.S. Pat. No. 7,087,970. The entire disclosure(s) of the prior application(s), application Ser. No. 10/927,114 is considered part of the disclosure of the accompanying Divisional application and is hereby incorporated by reference.

BACKGROUND OF THE INVENTION

1. Field of the Invention

The present invention relates to a laminated structure in which insulator layers and electrode layers are alternately stacked, and a method of manufacturing the laminated structure. Further, the present invention relates to an ultrasonic transducer array including a plurality of such laminated structures, to be used for ultrasonic diagnosis, nondestructive inspection and so on.

2. Description of a Related Art

Laminated structures in each of which insulator (dielectric) layers and electrode layers are alternately formed, are utilized, not only in laminated capacitors, but also in various other uses such as piezoelectric pumps, piezoelectric actuators and ultrasonic transducers. In recent years, with the developments of devices and equipment concerning MEMS (micro electromechanical systems), elements each having such a laminated structure have been microfabricated still further and packaged more highly.

In the microfabrication of an element having opposed electrodes, the smaller the area of the element is made, the smaller the capacitance between the electrodes becomes, so that a problem of rise in the electric impedance of the element occurs. On this account, when the electric impedance rises in a piezoelectric actuator, for example, the impedance matching between the piezoelectric actuator and a signal circuit for driving the piezoelectric actuator cannot be established, and it becomes difficult to feed power to the piezoelectric actuator, and thereby, the performance of the piezoelectric actuator is degraded. On the other hand, in an ultrasonic transducer employing a piezoelectric element, oscillation intensity of ultrasonic wave is dropped. Accordingly, in order to enlarge the capacitance between electrodes while microfabricating the element, it has been practiced to alternately stack a plurality of piezoelectric material layers and a plurality of electrode layers. This is because the capacitance between electrodes of the entire element can be enlarged by connecting the plurality of stacked layers in parallel.

Figure 9:
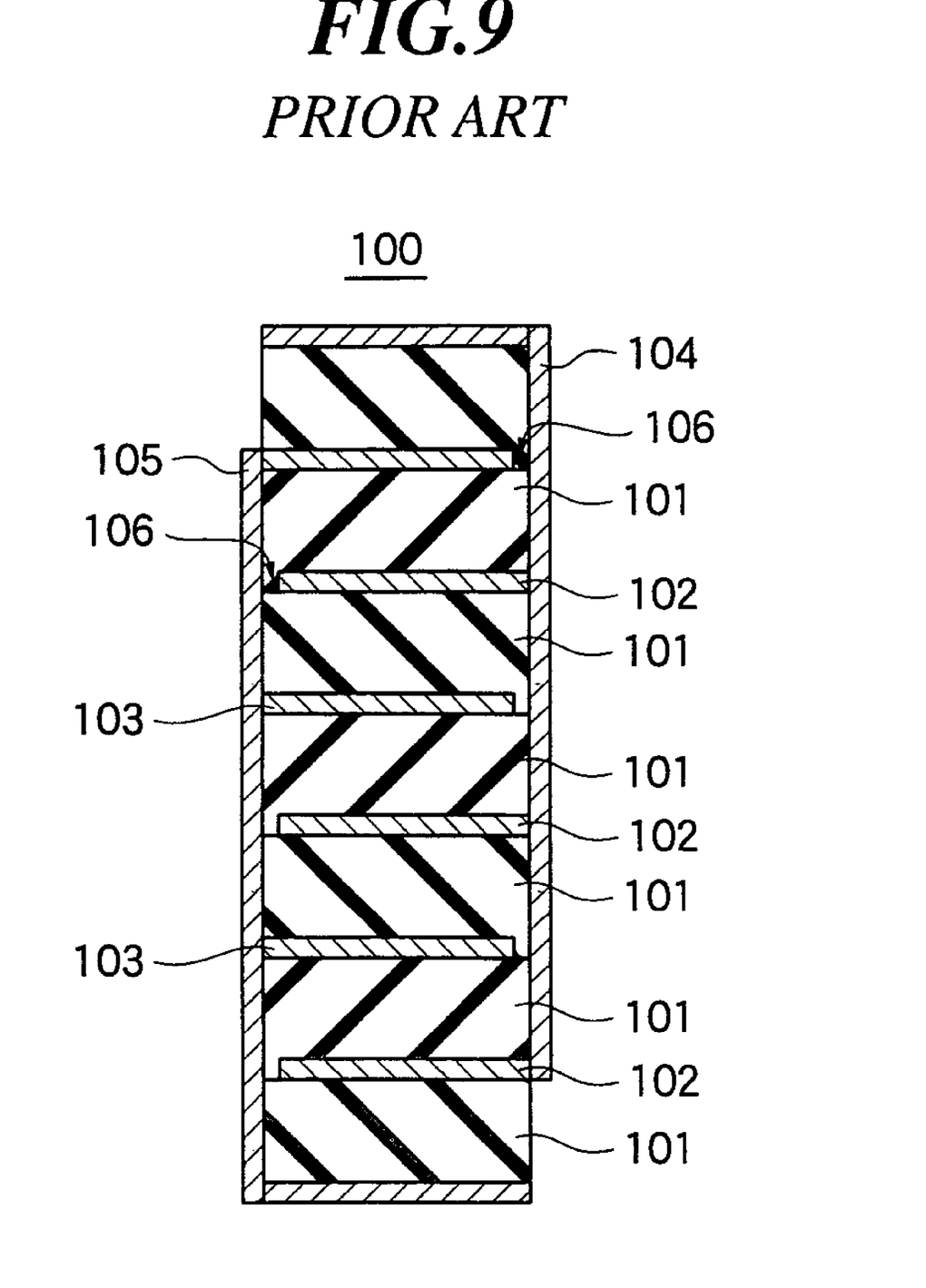
FIG. 9 is a diagram for explanation of an interconnection method in a conventional laminated structure.

In such a laminated structure, in order to connect the plurality of electrode layers to one another, interconnections are formed from side surfaces of the laminated structure. FIG. 9 is a sectional view for explanation of a general interconnection method of a laminated structure. A laminated structure 100 includes a plurality of piezoelectric material layers 101, a plurality of layers of electrodes 102 and 103 and side electrodes 104 and 105. The electrode 102 is so formed that one end thereof extends to one wall surface of the laminated structure, and the electrode 102 is connected to the side electrode 104 and insulated from the side electrode 105. Further, the electrode 103 is so formed that one end thereof extends to the other wall surface of the laminated structure, and the electrode 103 is connected to the side electrode 105 and insulated from the side electrode 104. By applying a potential difference between the side electrode 104 and the side electrode 105, a voltage is applied to the piezoelectric material layers 101 disposed between the electrodes 102 and 103, and the piezoelectric material layers 101 expand and contract by the piezoelectric effect.

By the way, as shown in FIG. 9, in the electrodes 102 and 103, insulating regions 106 where no electrode is formed are provided for insulating the electrodes from one of the side electrodes. The insulating regions 106 do not expand or contract even when a voltage is applied to the laminated structure 100. On this account, a problem that stress is concentrated on this part and the part is easy to break occurs.

As another interconnection method in the laminated structure, Japanese Patent Application Publication JP-P2002-118305A discloses an interconnection method of a multi-electrode piezoelectric device having a piezoelectric or an electrostrictive material with a large number of independently controlled electrodes, wherein a part or an entire of an electric circuit board having the piezoelectric/electrostrictive material on which electrodes for external connection are formed on the surface is coated with an insulative material, an interconnection pattern is formed on the surface thereof by removing the insulative material applied onto the electrodes for external connection, and a desired conduction between the electrodes and the interconnection pattern is established. However, forming interconnection to each of the large number of laminated structures in accordance with such method is complicated, and especially, in the case where the laminated structure is arrayed in a two-dimensional manner, the interconnection is difficult to be formed.

SUMMARY OF THE INVENTION

The present invention has been achieved in view of the above-described problems. A first object of the present invention is to provide a laminated structure with less breakage of insulative layers due to stress. Further, a second object of the present invention is to provide a manufacturing method of laminated structure by which such a laminated structure can be easily manufactured. Furthermore, a third object of the present invention is to provide an ultrasonic transducer array using such a laminated structure.

In order to solve the above-described problems, a laminated structure according to the present invention comprises at least a first electrode layer, a dielectric layer and a second electrode layer in which the first electrode layer, the dielectric layer and the second electrode layer are stacked in this order; wherein the first electrode layer includes a first electrode material disposed such that an end surface thereof is exposed in a first side region of the laminated structure and a second electrode material having an insulating film formed on an end surface thereof in a second side region different from the first side region of the laminated structure; and wherein the second electrode layer includes the first electrode material disposed such that an end surface thereof is exposed in the second side region of the laminated structure and the second electrode material having an insulating film formed on an end surface thereof in the first side region of the laminated structure.

Further, an ultrasonic transducer array according to the present invention comprises: an interconnection board; and a plurality of laminated structures disposed on the interconnection board, each of the plurality of laminated structures having at least a first electrode layer, a dielectric layer and a second electrode layer in which the first electrode layer, the dielectric layer and the second electrode layer are stacked in this order; wherein the first electrode layer in each of the plurality of laminated structures includes a first electrode material disposed such that an end surface thereof is exposed in a first side region of the laminated structure and a second electrode material having an insulating film formed on an end surface thereof in a second side region different from the first side region of the laminated structure; and wherein the second electrode layer in each of the plurality of laminated structures includes the first electrode material disposed such that an end surface thereof is exposed in the second side region of the laminated structure and the second electrode material having an insulating film formed on an end surface thereof in the first side region of the laminated structure.

Furthermore, a manufacturing method according to one aspect of the present invention is a method of manufacturing a laminated structure in which at least a first electrode layer, a dielectric layer and a second electrode layer are stacked in this order, wherein the method comprises the steps of: (a) forming a dielectric layer; (b) forming a first electrode layer as an upper layer of the dielectric layer formed at step (a) by disposing a first electrode material such that an end surface thereof is exposed in a first side region of the laminated structure and disposing a second electrode material such that an end surface thereof is exposed in a second side region different from the first side region of the laminated structure; (c) forming a dielectric layer as an upper layer of the first electrode layer formed at step (b); (d) forming a second electrode layer as an upper layer of the dielectric layer formed in step (c) by disposing the first electrode material such that an end surface thereof is exposed in the second side region of the laminated structure and disposing the second electrode material such that an end surface thereof is exposed in the first side region of the laminated structure; and (e) forming an insulating film on the end surface of the second electrode material exposed in each of the first and second side regions of the laminated structure.

Moreover, a manufacturing method according to another aspect of the present invention is a method of manufacturing a plurality of laminated structures in which at least a first electrode layer, a dielectric layer and a second electrode layer are stacked in this order, wherein the method comprises the steps of: (a) forming a dielectric layer; (b) forming a first electrode layer as an upper layer of the dielectric layer formed at step (a) by alternately disposing first electrode materials and second electrode materials different from the first electrode materials; (c) forming a dielectric layer as an upper layer of the first electrode layer formed at step (b); (d) forming a second electrode layer as an upper layer of the dielectric layer formed at step (c) by alternately disposing the first electrode materials and the second electrode materials reversely to positional relationship in the first electrode layer; (e) cutting a laminated structure formed at steps (a) to (d) in a stacked direction to divide the laminated structure into the plurality of laminated structures such that, with respect to each of the divided plurality of laminated structures, an end surface of the first electrode material in the first electrode layer and an end surface of the second electrode material in the second electrode layer are exposed in a first side region, and an end surface of the second electrode material in the first electrode layer and an end surface of the first electrode material in the second electrode layer are exposed in a second side region different from the first side region; and (f) forming an insulating film on the end surface of the second electrode material exposed in each of the first and second side regions with respect to each of the divided plurality of laminated structures.

According to the present invention, an electrode layer is formed by employing two kinds of materials and an electrode is insulated from one side electrode by oxidizing or fluorinating an end surface of one of those materials, and therefore, a region of a piezoelectric material layer on which the electrode is not disposed can be reduced to the minimum. As a result, a laminated structure with less breakage of the insulative layer due to stress can be fabricated easily.

DESCRIPTION OF THE PREFERRED EMBODIMENTS

Hereinafter, preferred embodiments of the present invention will be described in detail by referring to the drawings. The same component elements are assigned with the same reference numerals and the descriptions thereof will be omitted.

Figure 1:
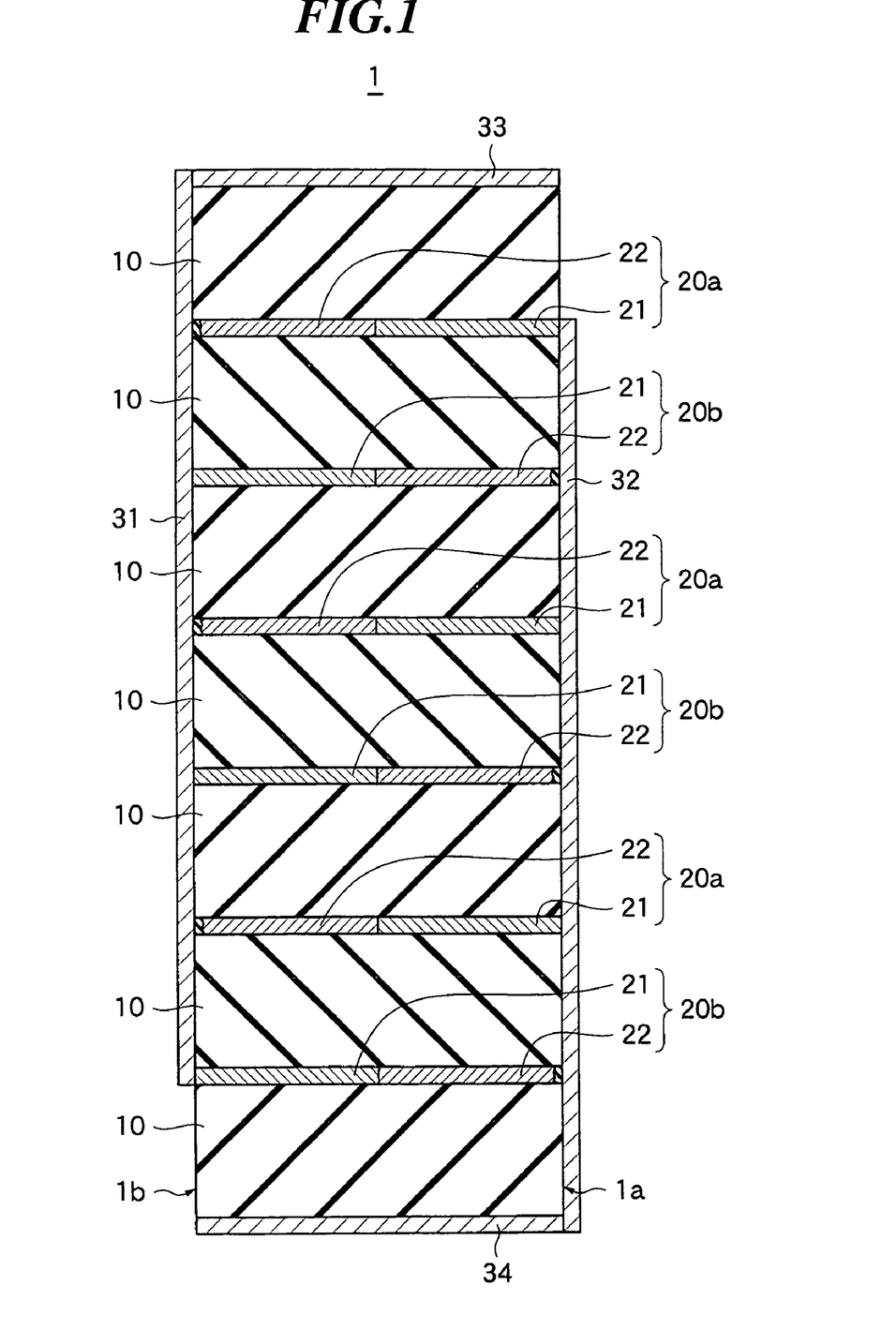
FIG. 1 is a sectional view showing a laminated structure according to the first embodiment of the present invention.

FIG. 1 is a sectional view showing a laminated structure according to the first embodiment of the present invention. The laminated structure 1 is a micro columnar structural body having a bottom surface with sides on the order of 0.2 mm to 1.0 mm and a height on the order of 1.0 mm. In this embodiment, a piezoelectric material is used as a dielectric. The laminated structure 1 includes a plurality of piezoelectric material layers 10, a plurality of electrode layers 20a and 20b containing two kinds of electrode materials, side electrodes 31 and 32 formed on side surfaces 1a and 1b of the laminated structure 1, respectively. Further, the laminated structure 1 may include an upper electrode 33 and a lower electrode 34 connected to the side electrodes 31 and 32, respectively. The shape of the bottom surface of the laminated structure 1 is not limited to a square shape, but may be a rectangular shape or other shapes. Further, the regions in which side electrodes are disposed are not limited to a pair of opposed side surfaces, but may be any regions if electrically separated.

The piezoelectric material layer 10 is formed by PZT (Pb (lead) zirconate titanate), for example. By applying a voltage to the piezoelectric material layer 10 via the electrode layers 20a and 20b, the piezoelectric material layer 10 expands and contracts by the piezoelectric effect. The laminated structure employing a piezoelectric material such as PZT as an insulative layer (dielectric layer) is used for a piezoelectric pump, a piezoelectric actuator, an ultrasonic transducer for transmitting and receiving ultrasonic waves in an ultrasonic probe, or the like. Further, such a laminated structure can increase the area of the opposed electrodes compared to a single layer structure, electric impedance can be reduced. Therefore, the laminated structure can operate efficiently in accordance with the applied voltage compared with the single layer structure.

Each of the electrode layers 20a and 20b has a first electrode material 21 and a second electrode material 22 as different two kinds of electrode materials.

In the electrode layer 20a, the first electrode material 21 is disposed such that the end surface thereof is exposed in the side surface 1a, and the second electrode material 22 is disposed such that the end surface thereof is exposed in the side surface 1b, which is different from the side surface 1a. On the other hand, in the electrode layer 20b, the first electrode material 21 is disposed such that the end surface thereof is exposed in the side surface 1b, and the second electrode material 22 is disposed such that the end surface thereof is exposed in the side surface 1a. Further, within each of the electrode layers 20a and 20b, the first electrode material 21 and the second electrode material 22 are disposed in contact with each other. Such electrode layers 20a and 20b are laminated alternately with the piezoelectric material layer 10 in between.

As shown in FIG. 1, the end surface of the second electrode material 22 exposed in each of the side surfaces 1a and 1b is oxidized. Thereby, the electrode layer 20a is insulated from the side electrode 31 disposed on the side surface 1b, and the electrode layer 20b is insulated from the side electrode 32 disposed on the side surface 1a. By constituting the internal electrodes (the electrode layers 20a and 20b) of the laminated structure 1 as described above, the stacked plurality of layers are connected in parallel.

Here, a material used as the first electrode material 21 and the second electrode material 22 will be described. In this embodiment, in order to insulate a predetermined part of the internal electrode, only one of the different two kinds of electrode materials is oxidized. Accordingly, as the material of the internal electrode, an oxidizable material and an inoxidizable material under the same use condition or processing condition are used in combination.

Furthermore, in addition to the view of such electric characteristics, it is necessary to select a material suitable for the manufacturing method to be used. For example, in the case where the aerosol deposition method (AD method) of spraying powder of a material to the under layer for deposition when a piezoelectric material layer 20 is formed, the hardness of the electrode material becomes significant. This is because if an electro material having low hardness is used, the electrode layer is scraped when the powder of the piezoelectric material is sprayed, while, if an electro material having too high hardness is used, the powder of the piezoelectric material cannot cut into the electrode layer and the piezoelectric material cannot be deposited. As the first electrode material 21 that can be used for the AD method, metal such as platinum (Pt) and palladium (Pd) or an alloy containing at least one of them, or a conductive oxide such as SRO (strontium ruthenium oxide: $SrRuO_3$) can be cited. Further, as the second electrode material 22 that can be used for the AD method, metal such as nickel (Ni), chromium (Cr), titanium (Ti), and cobalt (Co) or an alloy containing at least one of them can be cited. In this embodiment, platinum (Pt) is used as the first electrode material 21, and nickel (Ni) is used as the second electrode material 22. The AD method will be described later.

Next, a manufacturing method of laminated structure according to the first embodiment of the present invention will be described by referring to FIGS. 2A to 4. FIGS. 2A to 3D are diagrams for explanation of the manufacturing method of laminated structure according to this embodiment.

Figure 2A:
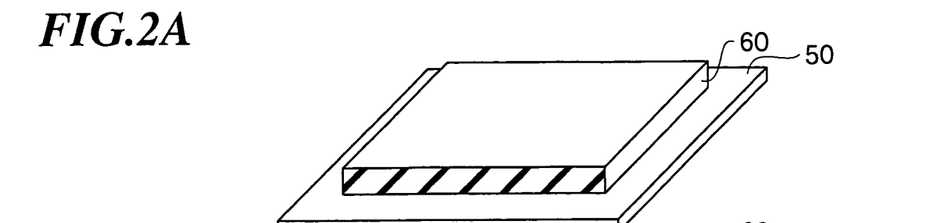
FIGS. 2A to 2E are diagrams for explanation of a manufacturing method of laminated structure according to the first embodiment of the present invention.

First, as shown in FIG. 2A, a piezoelectric material layer 60 is formed on a substrate 50. In the embodiment, the aerosol deposition (AD) method of forming a film by spraying powder of a material at high speed to the under layer for deposition is used. The aerosol deposition method is also called as a gas deposition method, jet printing system, or injection deposition method.

Figure 4:
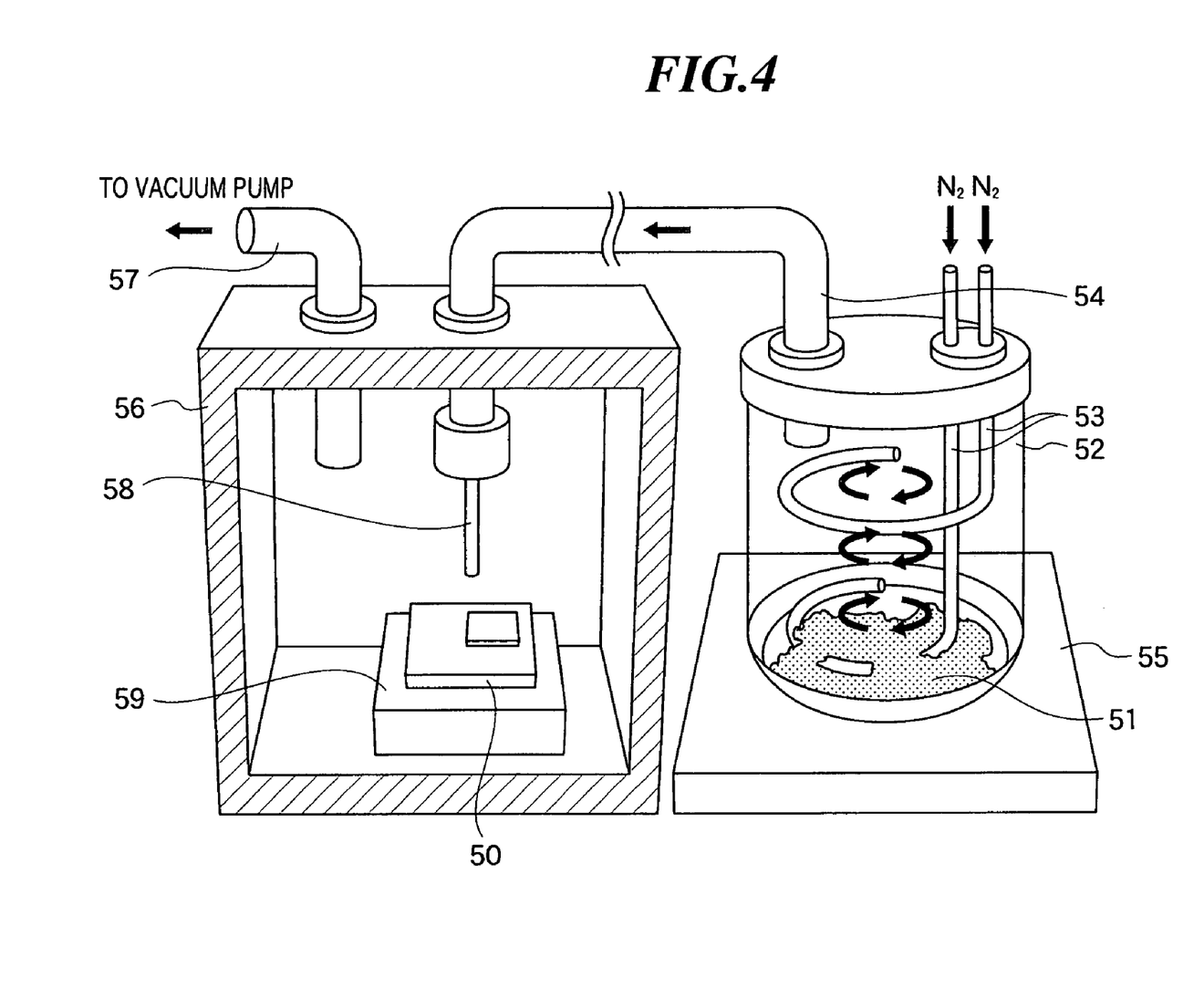
FIG. 4 is a schematic diagram showing the constitution of a film forming apparatus using the aerosol deposition method.

FIG. 4 is a schematic diagram showing a film forming apparatus according to the AD method. The film forming apparatus has an aerosol generating container 52 in which powder 51 of a row material is located. Here, the aerosol refers to fine particles of a solid or liquid floating in a gas. In the aerosol generating container 52, a carrier gas lead-in part 53, an aerosol lead-out part 54, and a vibrating part 55 are provided. By introducing a gas such as nitrogen gas ($N_2$) from the carrier gas lead-in part 53, the row material powder located within the aerosol generating container 52 is blown up to generate the aerosol. Simultaneously, by applying vibration to the aerosol generating container 52 by the vibrating part 55, the row material powder is agitated so as to generate the aerosol efficiently. The generated aerosol is guided through the aerosol lead-out part 54 to a film forming chamber 56.

In the film forming chamber 56, an exhaust pipe 57, a nozzle 58, and a movable stage 59 are provided. The exhaust pipe 57 is connected to a vacuum pump and exhausts air from inside of the film forming chamber 56. The aerosol generated in the aerosol generating container 52 and guided through the aerosol lead-out part 54 to the film forming chamber 56 is sprayed from the nozzle 58 toward the substrate 50. Thereby, the raw material powder impinges on the substrate 50 and is deposited thereon. At this time, the velocity of the aerosol particles sprayed from the nozzle onto the substrate 50 is on the order of 15 m/s to 450 m/s. In the AD method, it is thought that chemical reaction (mechanochemical reaction) is produced by the energy generated when particles having high energy accelerated to high speed impinge on the substrate, and thereby, a film is formed. The substrate 50 is mounted on the movable stage 59 movable in a three-dimensional manner, and the relative position between the substrate 50 and the nozzle 58 is adjusted by controlling the movable stage 59.

By employing, as the raw material, for example, PZT monocrystal powder having average particle diameter of 0.3 μm and driving the film forming apparatus shown in FIG. 4, the piezoelectric material layer 60 as shown in FIG. 2A is formed on the substrate 50.

Figure 2B:
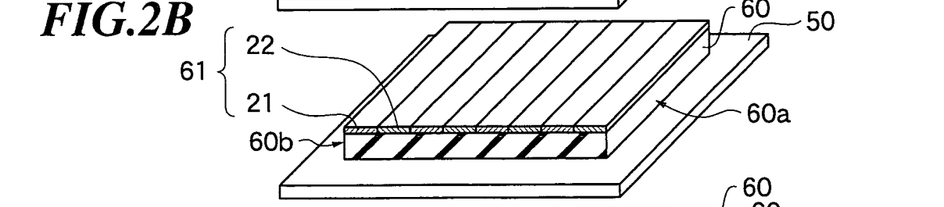

Then, as shown in FIG. 2B, an electrode layer 61 is formed by alternately disposing the first electrode materials (Pt electrode) 21 and the second electrode materials (Ni electrode) 22 in strip shapes. At that time, the Ni electrodes 22 are disposed on the side surface 60a side of the piezoelectric material layer 60, and the Pt electrodes 21 are disposed on the side surface 60b side. The electrode layer 61 can be formed in accordance with a film forming method such as sputtering or vacuum deposition and a photolithography method. Alternatively, the electrode layer 61 may be formed in accordance with the AD method.

Figure 2C:
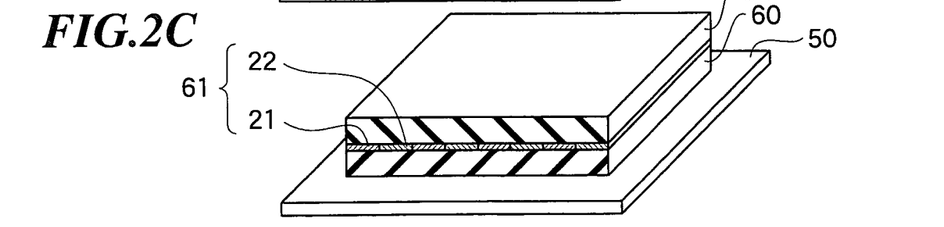

Then, as shown in FIG. 2C, the piezoelectric material layer 60 is formed in accordance with the AD method on the electrode layer 61.

Figure 2D:
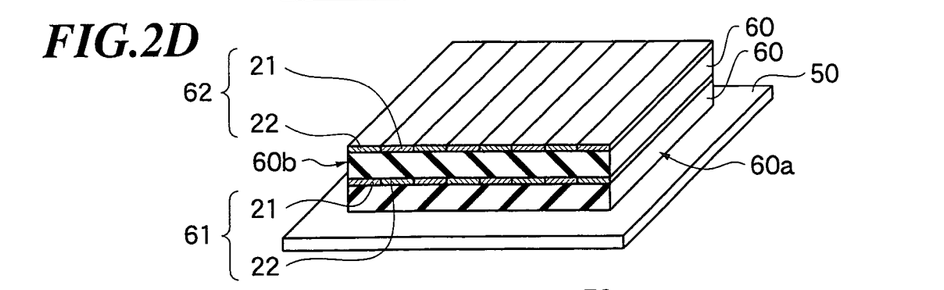

Next, as shown in FIG. 2D, an electrode layer 62 is formed by alternately disposing the first electrode materials (Pt electrode) 21 and the second electrode materials (Ni electrode) 22 in strip shapes. At that time, in order to reverse the positional relationship to that of the two kinds of electrodes in the electrode layer 61, the Pt electrodes 21 are disposed on the side surface 60a side of the piezoelectric material layer 60 and the Ni electrodes 22 are disposed on the side surface 60b side. The forming method etc. of the electrode layer 62 is the same as in the electrode layer 61.

Here, thicknesses of the electrode layer 61 and the electrode layer 62 are desirably made not less than 200 nm, and preferably made not less than 300 nm. The reason is as follows. On the electrode layer, the piezoelectric material layer 60 is formed in accordance with the AD method. According to the AD method, a phenomenon that the powder of deposited material cuts into the electrode layer as the under layer (this phenomenon is referred to as "anchoring") is produced. The thickness of the anchor layer (the layer into which the powder cuts) produced by the anchoring is normally on the order of 10 nm to 300 nm, which differs according to the material of the under layer (electrode layer), powder velocity and so on. Accordingly, in order to produce anchoring so as to make the electrode layer in close contact with the piezoelectric material layer and in order to allow the electrode layer to function well as electrodes, the electrode layer is required to have a thickness of at least about 200 nm. In this embodiment, the thicknesses of the electrode layers 61 and 62 are set to about 300 nm.

Figure 2E:
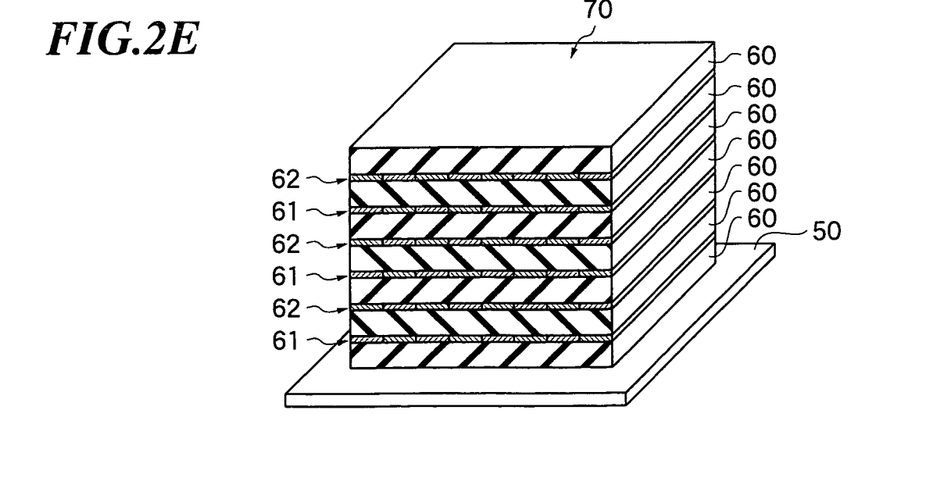

Steps of FIGS. 2A to 2D are repeated at plural times and thereby, a laminated structure 70 shown in FIG. 2E is formed.

Figure 3A:
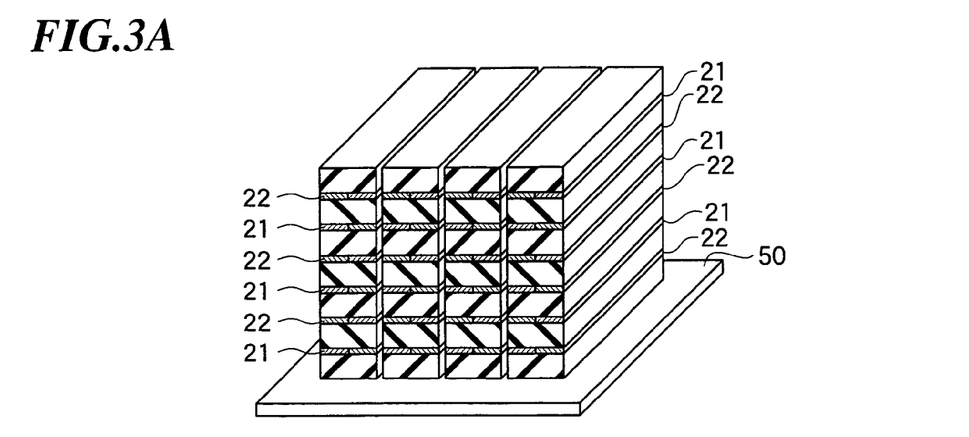
FIGS. 3A to 3D are diagrams for explanation of the manufacturing method of laminated structure according to the first embodiment of the present invention.
Figure 3B:
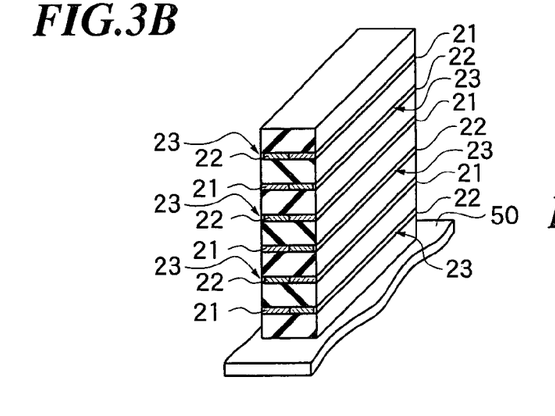

Next, as shown in FIG. 3A, the laminated structure 70 is divided by dicing. Alternatively, it can be divided in accordance with the sand blast method. Furthermore, the divided laminated structures are heat-treated in an oxygen atmosphere or air at about 500° C. to 1000° C. Thereby, the grain size of the PZT crystal contained in the piezoelectric material layer 60 is made larger and, as shown in FIG. 3B, the end surface of the Ni electrode 22 exposed in the side surface is oxidized and an oxide film 23 is formed.

Figure 3C:
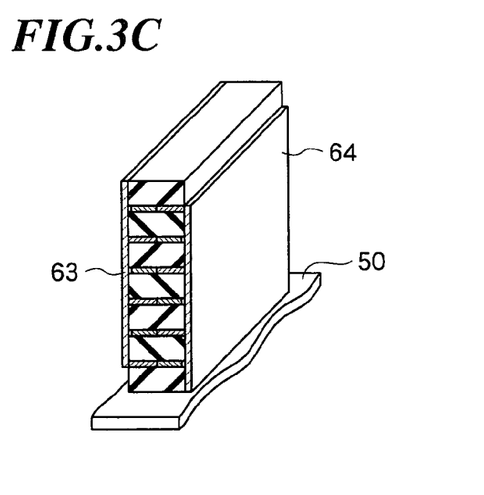
Figure 3D:
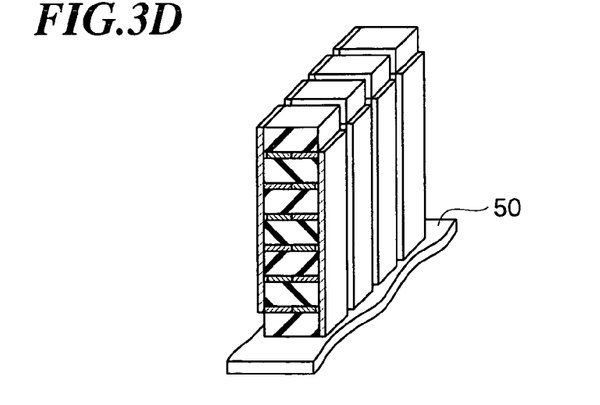

Then, on the heat-treated laminated structure, side electrodes 63 and 64 are formed. The side electrodes 63 and 64 are formed, like the side surface of the upper most piezoelectric material layer 60 and the side surface of the lower most piezoelectric material layer 60, in accordance with a deposition or sputtering method after masking the part to be insulated in advance. Alternatively, they may be formed in accordance with the photo CVD method. Further, the side electrodes may be formed by dipping the laminated structure in a plating bath. Thereby, as shown in FIG. 3C, a columnar laminated structure is fabricated. Simultaneously, the upper electrode 33 may be formed as shown in FIG. 1. Further, the columnar laminated structure may be divided along a direction perpendicular to the side electrodes. Thereby, a laminated structure as shown in FIG. 3D is fabricated. Furthermore, the substrate 50 may be removed from the laminated structures, and the lower electrode 34 may be formed on the independent laminated structure.

In the embodiment, as shown in FIG. 2A, the piezoelectric material layer is directly formed on the substrate 50, however, predetermined interconnection and plural electrodes may be provided on the substrate 50 in advance and the piezoelectric material layer may be formed thereon. In this case, the laminated structure 70 is divided according to the electrode arrangement that has been formed on the substrate 50 in advance. Thereby, the substrate 50 can be used as an interconnection board as it is, the trouble of removing the substrate and replacing the elements of the laminated structure can be saved.

Further, in the embodiment, the case where the laminated structure 70 is divided to fabricate plural laminated structures is described, however, the laminated structure 70 may be formed as one element (laminated structure 1 as shown in FIG. 1) without being divided. In this case, in FIGS. 2B and 2D, it is unnecessary to arrange the two kinds of electrode materials alternately in strip shapes, but they may be simply arranged such that the two kinds of electrode materials is exposed in the different side surfaces. Then, the end surface of one electrode material (Ni) exposed in the side surface may be oxidized to form the insulating film 23, and then, a side electrode and so on may be provided according to need.

As described above, according to the embodiment, the internal electrode of the laminated structure is constituted by two kinds of materials and insulated from one side electrode by oxidizing the end surface of one of those materials. Therefore, the region onto which stress concentrates in the piezoelectric material layer is made smaller to the minimum, and thereby, the breakage of the laminated structure can be reduced. Further, since the insulating film of the internal electrode is formed in the heat-treating step of the piezoelectric material layer, even in the case of fabricating vast amounts of microelements, they can be manufactured easily at low cost. Furthermore, according to the AD method when forming the piezoelectric material layer, an arrayed laminated structure in which plural laminated structure elements are arranged in a two-dimensional manner can be fabricated easily.

Figure 5:
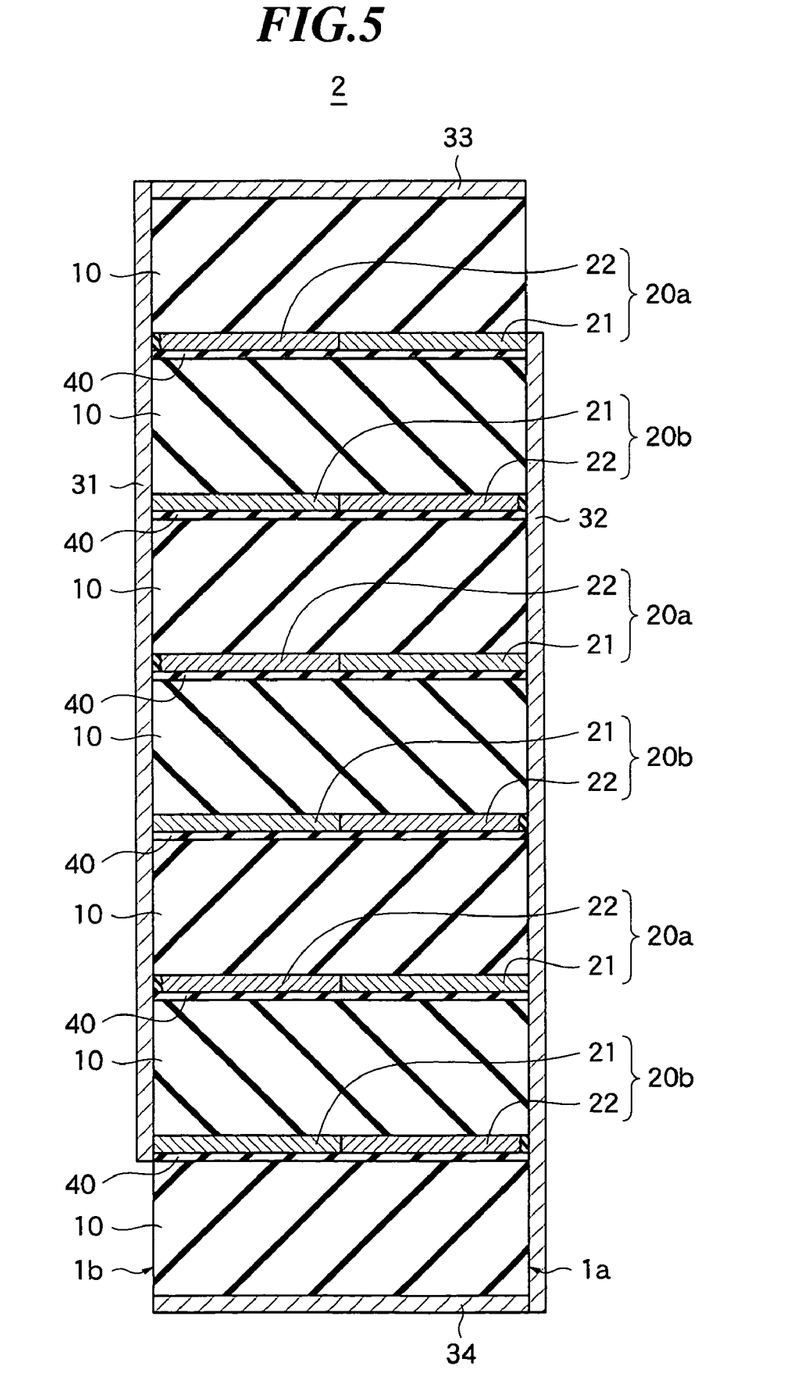
FIG. 5 is a sectional view showing a laminated structure according to the second embodiment of the present invention.

Next, a laminated structure according to the second embodiment of the present invention will be described. FIG. 5 is a sectional view showing the laminated structure according to this embodiment. In the second embodiment, the piezoelectric material is also used as the dielectric. The laminated structure 2 includes an adhesion layer 40 formed between the piezoelectric material layer 10 and the electrode layer 20a or 20b. Other constitution is the same as described in the first embodiment of the present invention.

The electrode layer in contact with the piezoelectric material layer is easily detached from the piezoelectric material layer due to oxidization by the oxygen generated when the piezoelectric material layer is heat-treated or the difference between coefficients of thermal expansion of the piezoelectric material layer and the electrode layer. Especially, since a thin film formed in accordance with the sputtering, vacuum deposition method, or the like has relatively low adhesion to the under layer, such phenomenon occurs remarkably. On this account, in the embodiment, in order to improve the adhesion between the piezoelectric material layer 10 and the electrode layer 20a or 20b, a material layer having high adhesion to both layers is provided between those layers. As the adhesion layer 40, a titanium (Ti) layer or titanium oxide ($TiO_2$) layer can be used, and, in the embodiment, for example, a titanium oxide layer having a thickness on the order of 50 nm is used. Titanium oxide has high adhesion to PZT and platinum, and further, since it has been oxidized in advance, it is never denatured even when oxygen enters from the under layer, i.e., the piezoelectric material layer, and the adhesion thereof can be maintained. In the case where the adhesion layer 40 is provided, before forming the electrode layers 61 and 62 in FIG. 2B or 2D, a film of titanium or titanium oxide may be formed on the piezoelectric material layer 60 in accordance with a method such as sputtering.

By the way, in the embodiment, no adhesion layer is provided between the under layer of the electrode 20a or 20b and the upper layer of the piezoelectric material layer. This is because, when the piezoelectric material layer is formed by the AD method, high adhesion can be held between those layers by the anchoring which means that the powder of the piezoelectric material cuts into the electrode layer of the under layer.

Next, a laminated structure according to the third embodiment of the present invention will be described. According to the above-described manufacturing method of the laminated structure according to the first embodiment, when the electrodes 20a and 20b shown in FIG. 1 or FIG. 5 are formed, the first electrode materials 21 and the second electrode materials 22 are arranged in strip shapes on the piezoelectric material layer such that the two kinds of electrode materials may be located in the width of one laminated structure 1 or 2. On the other hand, in the third embodiment, the respective electrode materials are formed such that the widths of the first electrode material 21 and the second electrode material 22 may be substantially equal to the width of one laminated structure. Other constitution is the same as described in the first and second embodiments of the present invention.

Figure 6A:
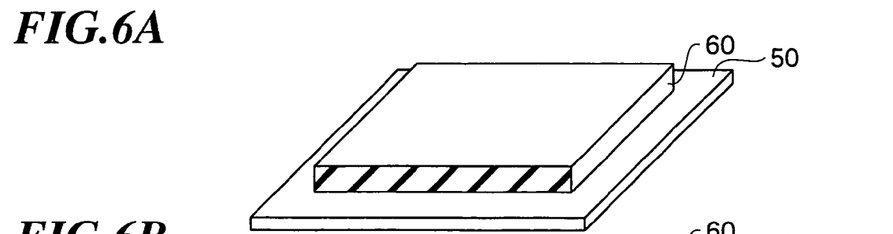
FIGS. 6A to 6E are diagrams for explanation of the manufacturing method of laminated structure according to the third embodiment of the present invention.

FIGS. 6A to 7B are diagrams for explanation of a manufacturing method of laminated structure according to the third embodiment of the present invention. First, as shown in FIG. 6A, as well as in the manufacturing method of laminated structure according to the first embodiment, after forming the piezoelectric material layer 60 on the substrate 50, an electrode layer 71 is formed by alternately disposing the first electrode materials (e.g., platinum) 21 and the second electrode materials (e.g., nickel) 22 on the piezoelectric material layer 60 such that each width thereof may be substantially equal to the width of one laminated structure 1 or 2 (FIG. 1 or FIG. 5) as shown in FIG. 6B. At this time, the first electrode material 21 and the second electrode material 22 are in contact with each other on the end surfaces thereof. Specifically, the electrode layer 71 is formed by disposing the first electrode materials 21 in accordance with the photolithography method using a mask in which slit-shaped apertures are formed at substantially equal widths and intervals to the width of the laminated structure 1 and a film forming method such as sputtering or vacuum deposition. After shifting the mask by the distance substantially equal to the width of the laminated structure 1, similarly arranging the second electrode materials 22 in accordance with the photolithography method and the film forming method. On both ends of the laminated structure as shown in FIG. 6B, the width of the first electrode material 21 and the second electrode material 22 may be smaller than the width of the laminated structure 1.

Figures 6B, 6C:
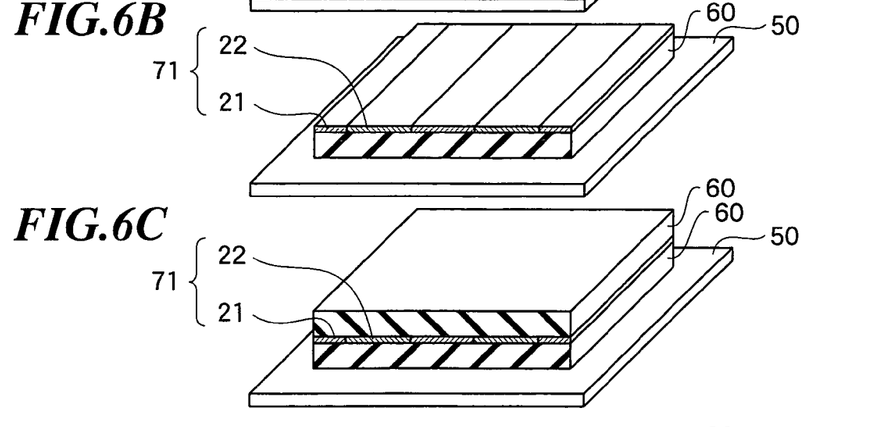

Next, as shown in FIG. 6C, on the electrode layer 71, the piezoelectric material layer 60 is formed in accordance with the AD method.

Figure 6D:
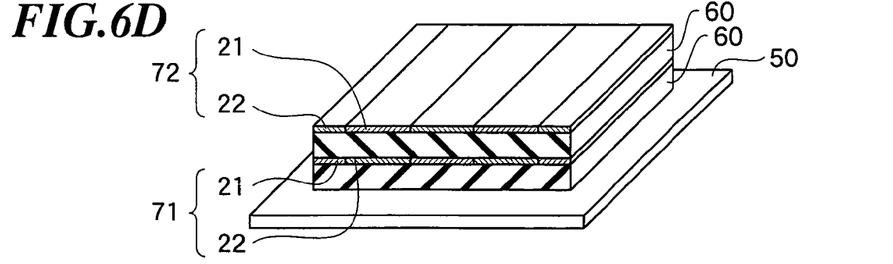

Then, as shown in FIG. 6D, an electrode layer 72 is formed by alternately disposing the first electrode materials 21 and the second electrode materials 22 on the piezoelectric material layer 60 such that each width thereof becomes substantially equal to the width of one laminated structure 1 or 2. At that time, the positional relationship between the first electrode materials 21 and the second electrode materials 22 is reversed to the positional relationship between them in the electrode layer 71. The forming methods of the electrode materials 21 and 22, etc. are the same as those in the electrode layer 71.

Figure 6E:
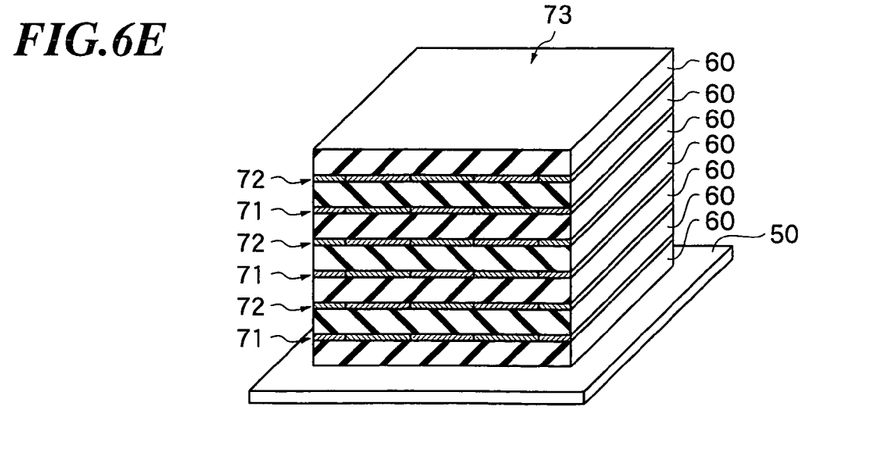

Furthermore, steps of FIGS. 6A to 6D are repeated at plural times and thereby, a laminated structure 73 shown in FIG. 6E is formed.

Figure 7A:
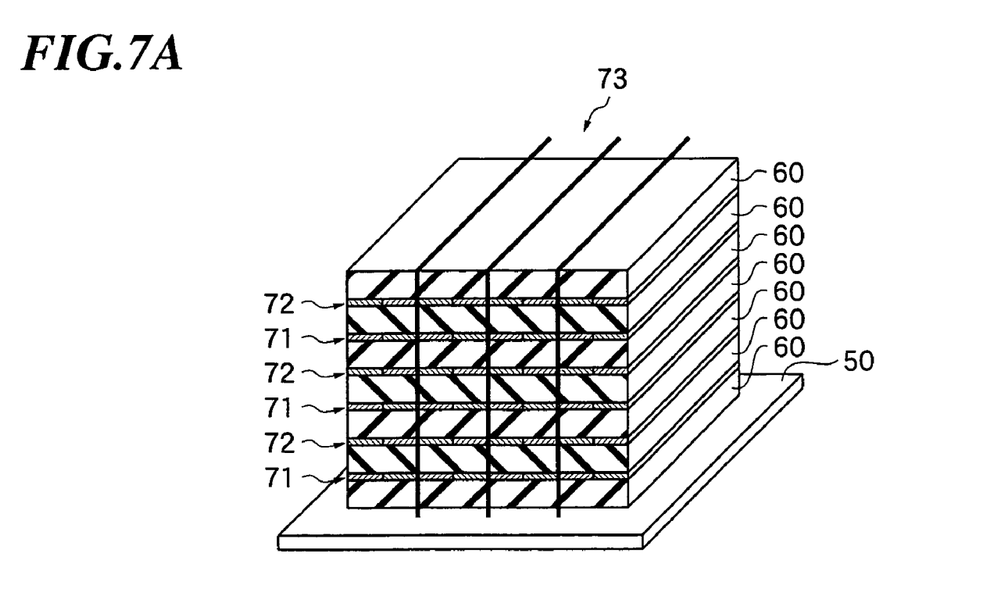
FIGS. 7A and 7B are diagrams for explanation of a manufacturing method of the laminated structure according to the third embodiment of the present invention.
Figure 7B:
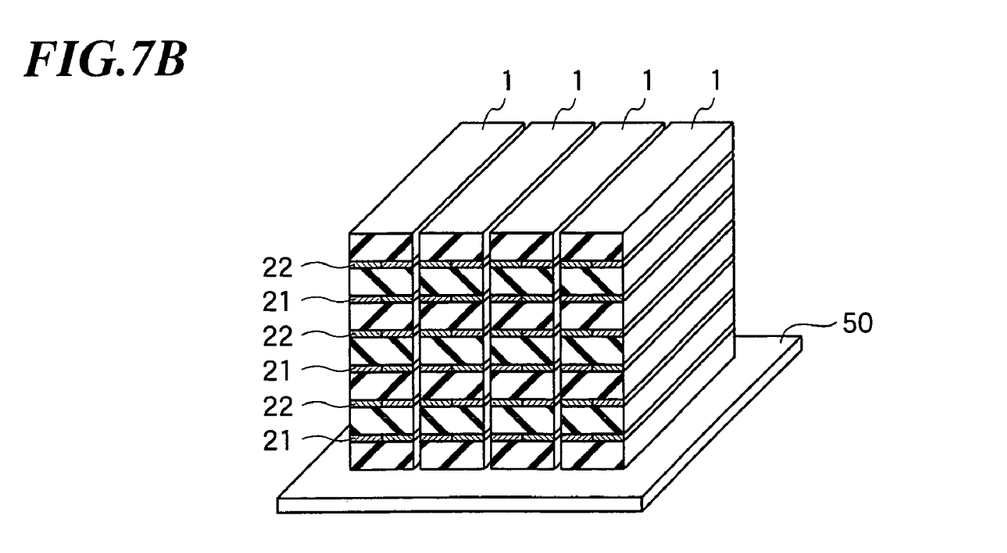

Next, as shown in FIG. 7A, in the laminated structure 73, the substantially central portion of the first electrode material 21 and the substantially central portion of the second electrode material 22 (heavy lines in the drawing) are diced. Thereby, as shown in FIG. 7B, a plurality of laminated structures 1 arranged in an array and including the electrode layers 71 and 72 each has the first electrode material 21 and the second electrode material 22 disposed are formed. The subsequent steps are the same as those in the first embodiment.

By forming the laminated structure 73 as described above, when the first electrode materials 21 and the second electrode materials 22 are formed, the accuracy of alignment of the electrode materials between the electrode layer 71 and the electrode layer 72 can be relatively relaxed, and the end surfaces of the respective electrode materials 21 and 22 can be reliably exposed in the side surfaces of the laminated structure 1 in precise positional relationship. By the way, in the embodiment, the nearly central portions of the first electrode materials 21 and the second electrode materials 22 are cut in the laminated structure 73, however, the position to be cut is not limited to that, and any position may be set other than the vicinity of the boundary of the first electrode material 21 and the second electrode material 22.

Further, after the laminated structure 73 shown in FIG. 7A is formed, the laminated structure 73 may be cut by arranging a mask on the laminated structure 73 and performing the sand blast method on the laminated structure 73 from above. In this case, the mask is disposed in a region including both first electrode material 21 and second electrode material 22. According to the method, for example, a laminated structure array in which each laminated structure has a cylindrical shape or a laminated structure array in which a plurality of laminated structures are arbitrarily arranged can be formed.

As described above, according to the manufacturing method of laminated structure according to the third embodiment, when internal electrodes of the laminated structure 73 are formed by two kinds of materials, one laminated structure is fabricated by arranging the respective electrode materials so as to have widths substantially equal to the width of one laminated structure, and, after formation of the laminated structure 73, cutting the nearly center portions of the electrode materials. Therefore, in the case where the electrodes are formed by employing two kinds of materials, positional accuracy of the positional relationship between the different electrode layers can be relaxed, and the two kinds of electrode materials can be reliably exposed in the side surfaces in precise positional relationship in the respective laminated structures after being cut. Further, in the case where the laminated structure 73 is cut in accordance with the sand blast method using a mask, laminated structures having desired shapes (e.g., cylindrical shape) or desired arrangement (e.g., concentric arrangement) can be fabricated according to the shape of the mask.

In the above-described first to third embodiments of the present invention, the piezoelectric material layer is formed by the AD method, however, as the piezoelectric material layer, a PZT plate material formed in a plate shape in advance may be used. In this case, in order to improve the adhesion between the PZT plate material and the electrode layer, an adhesion layer is desirably provided not only in the upper layer of the PZT plate material, but also in the under layer thereof. Further, in this case, since it becomes unnecessary to consider the anchoring by the AD method, the kinds of metals to be used for the first electrode material and the second electrode material are not required to be selected in view of hardness, but may be selected in view of electric characteristics such as easiness of oxidization.

Further, in the first to third embodiments of the present invention, the insulating film on the end surface of the internal electrode is formed by oxidizing the second electrode material, however, the film may be formed by fluorinating the second electrode material. Specifically, for example, nickel is used as the second electrode material and nickel fluoride ($NiF_2$) is formed by fluorinating the end surface thereof. To fluorinate nickel, for example, nickel chloride is formed by using hydrochloric acid, and then, subjected to the action of fluorine at 150° C.

Furthermore, in the first to third embodiments of the present invention, a piezoelectric material is used as the dielectric layer, however, another dielectric material may be used. For example, by employing barium titanate ($TiBaO_3$) as a ferroelectric, a multi-layer capacitor can be fabricated. In this case, by applying the above-described embodiments to the multi-layer capacitor, the electric capacitance can be increased because the region in which an electrode is not provided in the dielectric layer can be reduced. Further, by using the manufacturing method according to the above-described embodiments, a capacitor having a laminated structure can be manufactured easily.

Figure 8:
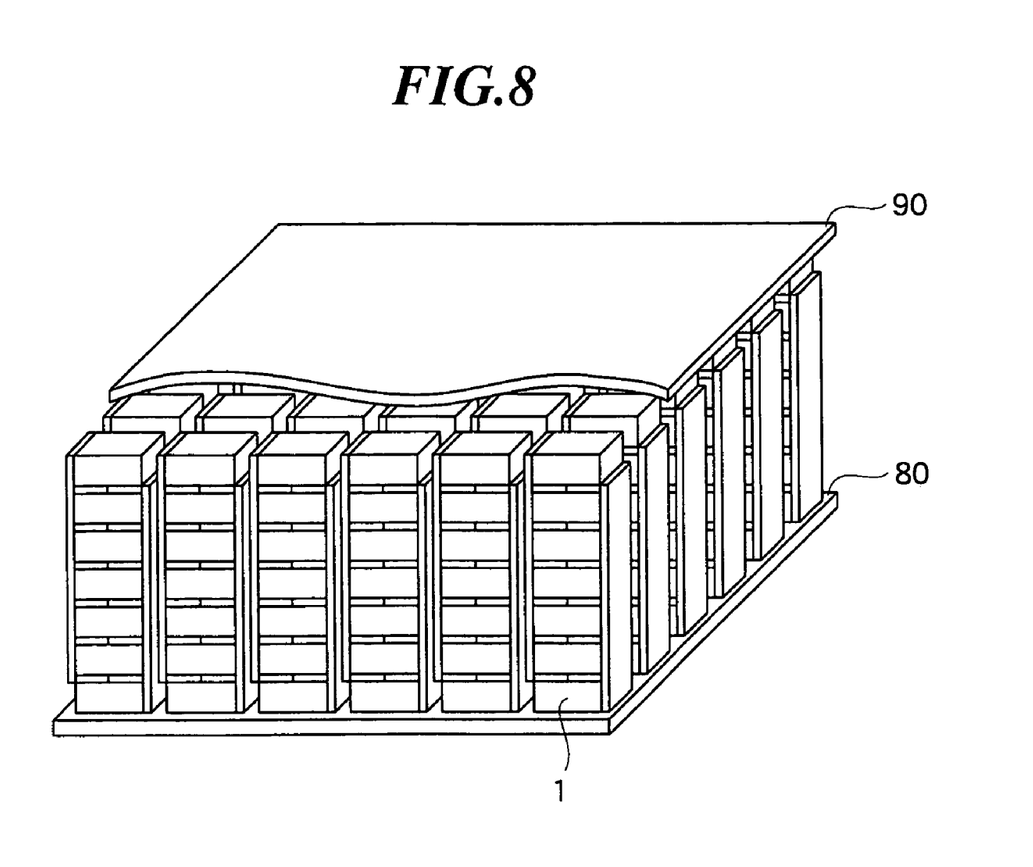
FIG. 8 is a perspective view showing an ultrasonic transducer array according to one embodiment of the present invention.

FIG. 8 is a perspective view showing an ultrasonic transducer array according to one embodiment of the present invention. This ultrasonic transducer array includes a plurality of laminated structures 1 as shown in FIG. 1, an interconnection board 80, and a common electrode 90. The plurality of laminated structures 1 are arranged in a two-dimensional matrix form on the interconnection board 80.

On the interconnection board 80, a plurality of electrodes are formed corresponding to the arrangement of the plurality of laminated structures 1. Ultrasonic waves are generated from the laminated structures 1 by applying voltages to the respective laminated structures 1 via the plurality of electrodes and the common electrode 90. At this time, by driving each of the laminated structures 1 with predetermined delay time, an ultrasonic beam focused in a desired direction and a depth can be formed.

Here, the arrangement of the plurality of laminated structures is not limited to the two-dimensional matrix form. For example, one-dimensional array, two-dimensional array in which several one-dimensional arrays are arranged in parallel (also referred to as "1.5-dimensional array"), concentric form arrangement or random arrangement may be adopted. Further, in place of the plurality of laminated structures 1, the plurality of laminated structures 2 as shown in FIG. 5 may be used. Furthermore, by providing an acoustic matching layer, a backing layer and so on to such ultrasonic transducer array, an ultrasonic probe to be used for ultrasonic diagnostic equipment can be fabricated.

The invention claimed is:

1. A method of manufacturing a plurality of laminated structures in which at least a first electrode layer, a dielectric layer and a second electrode layer are stacked in this order, said method comprising the steps of:

(a) forming a dielectric layer;
(b) forming a first electrode layer as an upper layer of said dielectric layer formed at step (a) by alternately disposing strips of first electrode materials and strips of second electrode material different from said first electrode material, in contact with each other;
(c) forming a dielectric layer as an upper layer of said first electrode layer formed at step (b);
(d) forming a second electrode layer as an upper layer of said dielectric layer formed at step (c) by alternately disposing said strips of first electrode materials and said strips of second electrode materials reversely to positional relationship in said first electrode layer and in contact with each other;
(e) cutting a laminated structure formed by steps (a) to (d) in a stacked direction to divide the laminated structure into a divided plurality of laminated structures such that, with respect to each of the divided plurality of laminated structures, an end surface of a strip of first electrode material in said first electrode layer and an end surface of a strip of second electrode material in said second electrode layer are exposed in a first side region, and an end surface of a strip of second electrode material in said first electrode layer and an end surface of a strip of first electrode material in said second electrode layer are exposed in a second side region different from said first side region; and
(f) forming an insulating film on the end surface of said strip of second electrode material exposed in each of the first and second side regions with respect to each of the divided plurality of laminated structures.

2. The method according to claim 1, wherein step (f) includes forming the insulating film by oxidizing the end surface of said strip of second electrode material exposed in each of the first and second side regions of said laminated structure.

3. The method according to claim 1, wherein step (f) includes forming the insulating film by fluorinating the end surface of said strip of second electrode material exposed in each of the first and second side regions of said laminated structure.

4. The method according to claim 1, further comprising the step of forming at least one side electrode on the first side region and the second side region of each of said divided plurality of laminated structures.

* * * * *